United States Patent
Venkatramani et al.

(12) 
(10) Patent No.: US 10,298,208 B1
(45) Date of Patent: May 21, 2019

(54) DYNAMIC IMPEDANCE SYSTEM FOR AN INCREASED RANGE OF OPERATION OF AN INSTRUMENT TRANSFORMER

(71) Applicants: Anand Venkatramani, Bangalore (IN); Siraj Issani, Bangalore (IN)

(72) Inventors: Anand Venkatramani, Bangalore (IN); Siraj Issani, Bangalore (IN)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 16/003,360

(22) Filed: Jun. 8, 2018

(51) Int. Cl.
| | |
|---|---|
| *H03H 11/28* | (2006.01) |
| *H01F 38/20* | (2006.01) |
| *H01F 27/28* | (2006.01) |
| *H01F 27/24* | (2006.01) |
| *H01F 27/42* | (2006.01) |

(52) U.S. Cl.
CPC .............. *H03H 11/28* (2013.01); *H01F 27/24* (2013.01); *H01F 27/28* (2013.01); *H01F 27/427* (2013.01); *H01F 38/20* (2013.01)

(58) Field of Classification Search
None
See application file for complete search history.

(56) References Cited

U.S. PATENT DOCUMENTS

| | | | | |
|---|---|---|---|---|
| 5,457,621 A | * | 10/1995 | Munday | G01R 21/133 363/131 |
| 6,504,357 B1 | * | 1/2003 | Hemminger | G01D 4/00 324/142 |
| 2010/0084920 A1 | * | 4/2010 | Banting | G01R 15/142 307/66 |
| 2015/0023804 A1 | * | 1/2015 | Sugiura | F04D 25/0606 417/44.11 |
| 2017/0047734 A1 | * | 2/2017 | Jankowski | G01R 1/36 |

* cited by examiner

*Primary Examiner* — Cassandra F Cox
(74) *Attorney, Agent, or Firm* — Lempia Summerfield Katz LLC

(57) ABSTRACT

A dynamic impedance system deployable on a current transformer having a core and at least one winding element is provided. The dynamic impedance system includes a voltage reference module and a dynamic impedance module operably connected to one another. The voltage reference module defines a voltage threshold for regulating an output voltage of the current transformer. The dynamic impedance module regulates the output voltage based on the voltage threshold defined by the voltage reference module to maintain flux induced in the current transformer, thereby avoiding core saturation of the current transformer and enhancing accuracy of measurements.

8 Claims, 5 Drawing Sheets

(STATE OF ART)

DYNAMIC IMPEDANCE SYSTEM FOR AN INCREASED RANGE OF OPERATION OF AN INSTRUMENT TRANSFORMER

The present disclosure in general relates to electrical inductive apparatus, such as instrument transformers, and more specifically to a dynamic impedance system that increases a range of operation of an instrument transformer. The technology described herein is particularly well-suited for, but not limited to, current transformers.

BACKGROUND

Current transformers (CTs) are widely used in the electric power industry to measure line current for protection and metering. The line current is applied to a primary coil of the CT, and a reduced-magnitude version of the line current is produced on a secondary coil of the CT. This reduced-magnitude version of the line current is suitable for electronic measurement, monitoring, and control and protection applications of power equipment in the electrical network. Typically, during faults and disturbances, due to high electrical current flowing through the CT, the core of the CT saturates. This results in generation of a distorted secondary signal as an output at the secondary terminals of the CT, thereby having a condition of incorrect representation of the electric current flowing in the electrical network. This core saturation phenomenon can adversely affect all the measuring, monitoring and protection applications that rely on the current output from CT. Because the output of the CT may not indicate the true current in the electric network during the fault and disturbance condition, adequate protection and control decisions implemented through the protection devices may get affected, thereby resulting in damage of equipment connected in the electrical network.

Moreover, signal conditioning and measurement circuits typically need voltage and/or current as an input and hence the voltage and/or current of the secondary of the CT are signal conditioned to an appropriate voltage and used for measurement and monitoring purposes. Conventional approaches involve connecting a static burden resistance to the secondary of the CT. This burden resistance sets the operating range of the CT. The lower operating range decides the accuracy specification because the voltage across the burden resistance is small. The higher operating range is decided based on the signal conditioning circuit and saturation limit of the core. With increasing primary current, flux in the magnetic core increases, pushing it towards saturation. Furthermore, with an increase in flux, the non-linear behaviour posed by the magnetic material of the core increases, thereby resulting in higher errors at higher operating ranges.

FIG. 1 depicts a part of an equivalent circuit 100 of a conventional current transformer having a burden resistor $r_b$ connected with a secondary coil represented by a resistor $r_{Coil}$, of the current transformer. The excitation quantity for the system is the primary current $I_P$. The governing equations for the system are:

$$\Phi = \frac{N_P I_P - N_s I_s}{R}$$

$$\Phi = \frac{I_S * (r_b + r_{Coil})}{(N_S * \omega)}$$

Where: $\Phi$—core flux, $I_P$—primary current, $N_P$—number of turns of the primary, which are typically=1 for a current transformer application, $I_S$—secondary current, $N_S$—number of turns of the secondary coil, R—reluctance of the magnetic core, $r_b$—secondary burden resistance, $r_{Coil}$—resistance of the secondary coil and $\omega$—frequency of excitation. Solving these two equations we can derive the equation for $\Phi$ as a function of the excitation, that is, a function of the primary current, using the equation below:

$$\Phi = \frac{[N_P I_P * (r_b + r_{Coil})]}{[(N_S^2 * \omega) + R * (r_b + r_{Coil})]}$$

In a conventional scenario, the burden resistance $r_b$ is kept constant. With all other quantities as constant, it is seen that $\Phi$ is proportional to $I_P$ and thus increases with an increase in $I_P$. Thus the flux $\Phi$ increases thereby, climbing upward in the B-H curve associated with the current transformer. Above a certain limit, the flux $\Phi$ saturates causing distortions in the secondary voltage and measurements. Due to this there still exists a non-linearity in the conventional burden resistor based systems. Moreover, in case of higher operating primary currents, the current through the burden resistor $r_b$ increases. This increases the power dissipation and the temperature of the burden resistor $r_b$. With further increase in temperature, resistance of the burden resistor $r_b$ changes thereby, affecting accuracy of measurements.

Conventional approaches are typically aimed at detecting saturation in a current transformer, wherein if saturation is detected, the information is used to restrain/adapt a protection device's measurements dependent on the data measured by the current transformer by employing curve fitting, look up tables, etc. Some other methods typically use artificial intelligence techniques like neural networks to detect this saturation wherein huge amount of past data is required to train the neural network. However, these conventional approaches are largely aimed at correction of the errors occurring as a result of core saturation. Moreover, calibrating such errors is tedious as the measurements are dependent on material properties of the core which vary with temperature. Furthermore, calibration of these errors is difficult because it requires determination of fine points which will also vary with materials and environmental factors.

Therefore, it is an object of the present disclosure to provide a device of the aforementioned kind that extends an operating range of a current transformer by preventing the transformer core from saturating thereby, resulting in an increased accuracy of measurement at higher primary currents and protection of downstream electronics at higher operating currents.

SUMMARY

This summary is provided to introduce a selection of concepts in a simplified form that are further disclosed in the detailed description. This summary is not intended to identify key or essential concepts of the claimed subject matter, nor is it intended for determining the scope of the claimed subject matter.

The present disclosure achieves the aforementioned object by providing a dynamic impedance system deployable on a current transformer. In one aspect of the present disclosure, the dynamic impedance system is employed for an instrument transformer. In yet another aspect of the present disclosure, the dynamic impedance system is disclosed for an electrical inductive apparatus that faces core saturation issues. The dynamic impedance system includes a voltage reference module and a dynamic impedance module in operable communication with one another. The voltage reference module defines a voltage threshold for regulating an output voltage of the current transformer. In an aspect of the present disclosure, the voltage reference module defines the voltage threshold based on one or more properties associated with the current transformer. These properties include, for example, a material and a geometry of a core and winding elements of the current transformer, a saturation limit of the core, and the output voltage of the current transformer. The voltage reference module includes at least one diode selected based on the voltage threshold. For example, one or more diodes having a net rated biasing voltage equal to the voltage threshold.

The dynamic impedance module regulates the output voltage based on the threshold defined by the voltage reference module to maintain flux induced in the current transformer. The dynamic impedance module is configured as a variable load for the current transformer and includes at least one power transistor selected based on the voltage threshold and in operable communication with the voltage reference module.

In another aspect of the present disclosure, a current transformer is disclosed. The current transformer includes a core, at least one winding element, for example, a primary winding element passing through the core and a secondary winding element at least partially surrounding the core, and a dynamic impedance system as disclosed above, in operable communication with the winding element, that is, at least one of the primary and secondary winding elements employed to maintain flux induced in the current transformer.

The above-mentioned and other features of the disclosure will now be addressed with reference to the accompanying drawings of the present disclosure. The illustrated embodiments are intended to illustrate, but not limit the disclosure.

BRIEF DESCRIPTION OF THE DRAWINGS

The foregoing and other aspects of the present disclosure are best understood from the following detailed description when read in connection with the accompanying drawings. For the purpose of illustrating the disclosure, it is understood that scope of the present disclosure is not limited to the specific instrumentalities disclosed. Included in the drawings are the following Figures.

Figure 1:
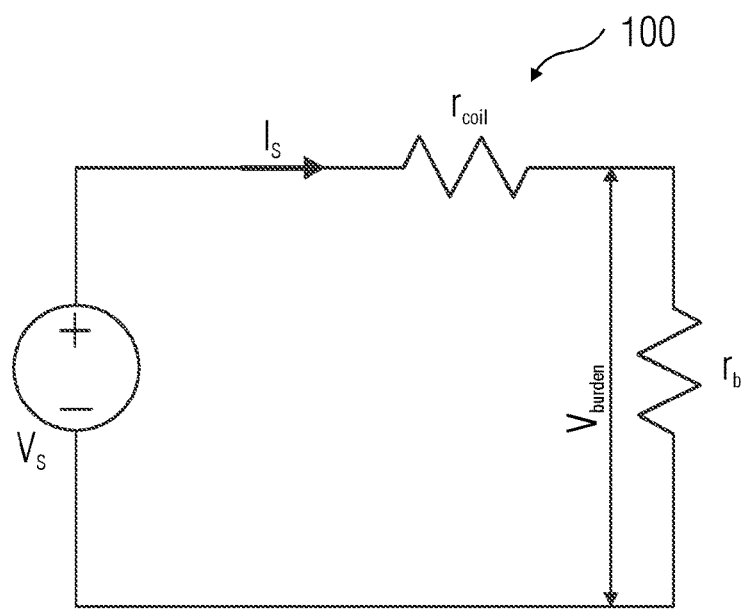
FIG. 1 depicts a part of an equivalent circuit of a conventional current transformer having a burden resistor connected with a secondary coil represented by a resistor, of the current transformer.

The foregoing summary, as well as the following detailed description, is better understood when read in conjunction with the appended drawings. For the purpose of illustrating the disclosure, exemplary constructions are shown in the drawings. However, the disclosure is not limited to the specific methods and structures disclosed herein. The description of a device or a structure referenced by a numeral in a drawing is applicable to the description of that device or structure shown by that same numeral in any subsequent drawing herein.

DETAILED DESCRIPTION

Figure 2A:
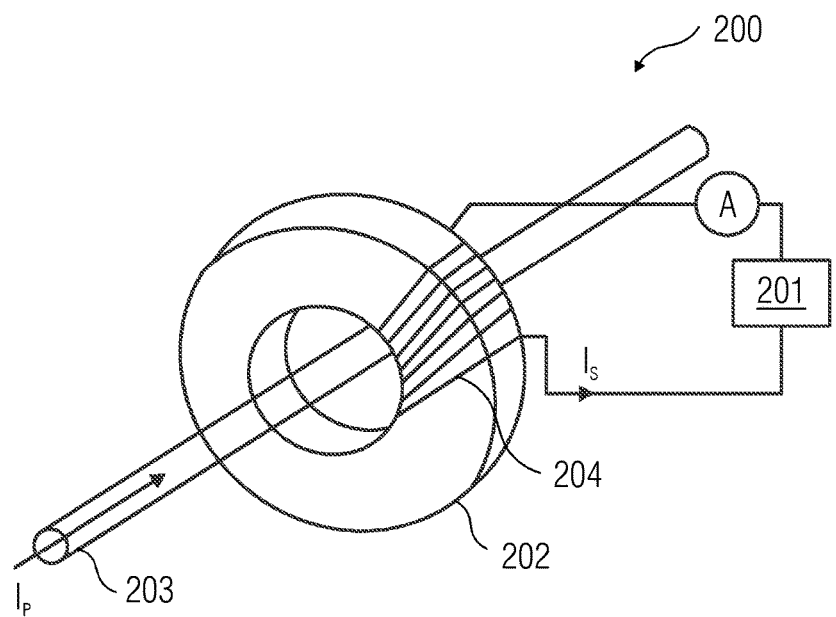
FIGS. 2A-2C depict a current transformer in operable communication with a dynamic impedance system including a voltage reference module and a dynamic impedance module as per present disclosure.
Figure 2B:
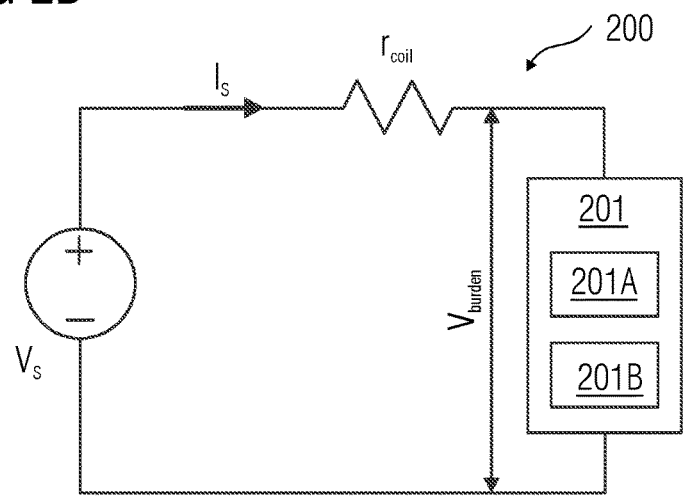
Figure 2C:
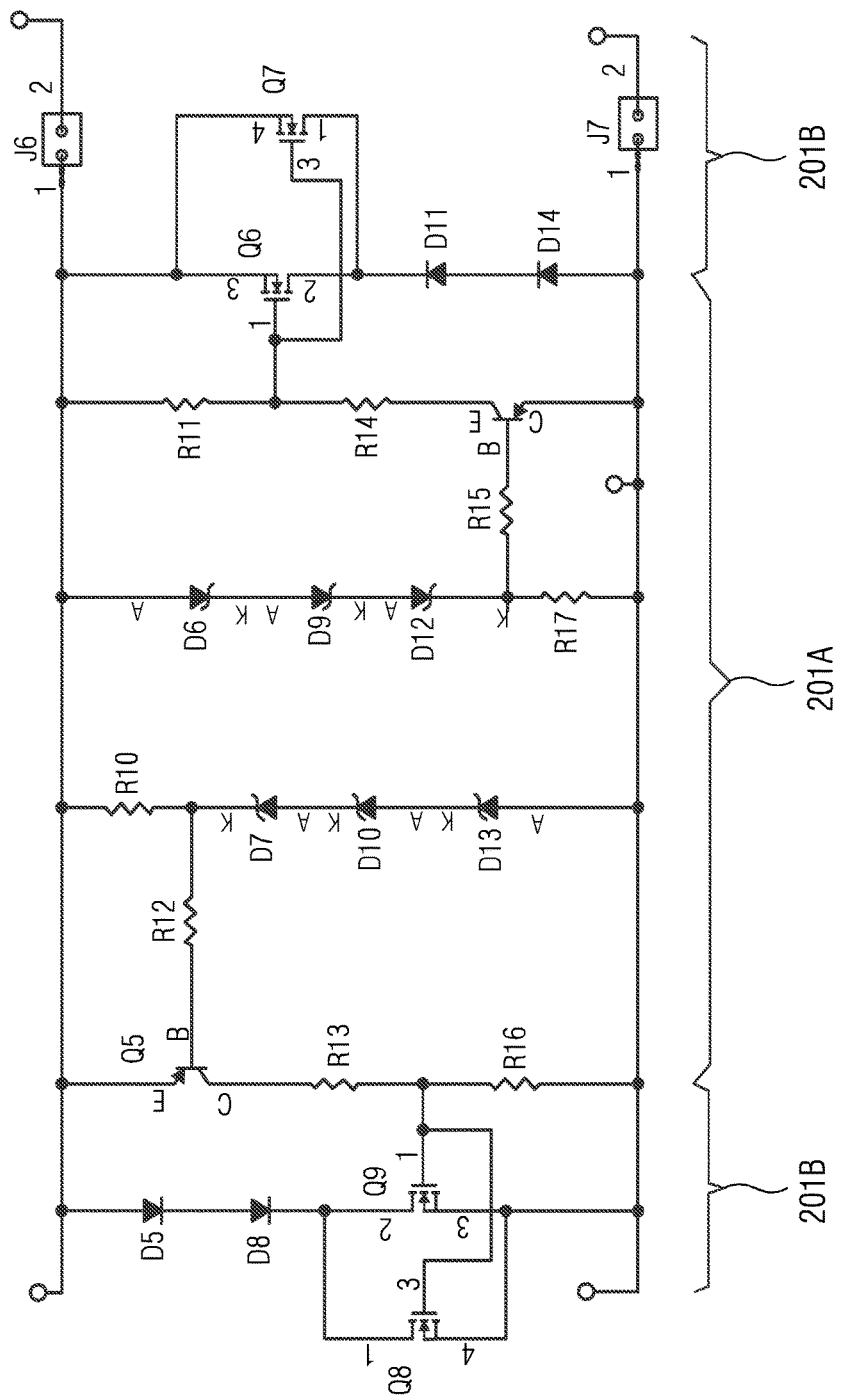

FIGS. 2A-2C depict a current transformer 200 in operable communication with a dynamic impedance system 201 including a voltage reference module 201A and a dynamic impedance module 201B as per present disclosure. FIG. 2A depicts a perspective view of the current transformer 200 including a core 202 such as a laminated magnetic core, a primary winding element 203 such as a high voltage winding and a secondary winding element 204 such as a low voltage winding in operable communication with the dynamic impedance system 201 and supplying current to a load (not shown) or to a measurement device such as an ammeter A. The measured current, that is, the secondary current $I_S$, may form an input to an external device, for example, a protection device and/or a sensing device employed in a power network such as an overhead fault sensing indicator wherein the primary winding element 203 is an overhead current carrying conductor. The primary winding element 203 may include a single flat turn, a coil of heavy duty wire wrapped around the core 202, or a conductor or a bus bar placed through the core 202 as depicted in FIG. 2A. The secondary winding element 204 may include a number of coil turns wound on the core 202 as depicted in FIG. 2A. The current transformer 200 may be a wound current transformer, a toroidal current transformer, or a bar-type current transformer. A primary current $I_P$ flows through the primary winding element 203 and a secondary current $I_S$ flows through the secondary winding element 204. The dynamic impedance system 201 is connected with the secondary winding element 204 so as to receive the secondary current $I_S$.

FIG. 2B depicts an electrical equivalent circuit of the current transformer 200 depicted in FIG. 2A. The dynamic impedance system 201 including the voltage reference module 201A and the dynamic impedance module 201B, acts as a variable load for the current transformer 200 to maintain a constant secondary voltage $V_{burden}$ despite of an increase in the secondary current $I_S$. This is achieved by shunting the increased secondary current $I_S$ using the dynamic impedance module 201B, thereby regulating flux induced in the core 202 as a result of the increase in secondary current $I_S$. The dynamic impedance system 201 thus, regulates the current in the secondary $I_S$ by maintaining the secondary voltage $V_{burden}$ constant, thereby, ensuring that the flux $\Phi$ in the core 202 of the current transformer 200 is maintained constant, based on the equation below.

$$\Phi = \frac{N_P I_P * (r_b + r_{Coil})}{(Ns^2 * \omega) + R * (r_b + r_{Coil})}$$

where: $\Phi$—core flux, $I_P$—primary current, $N_P$—number of turns of the primary, $I_S$—secondary current, $N_S$—number of turns of the secondary coil, R—reluctance of the magnetic core, $r_b$—burden resistance posed by the dynamic impedance module 201B, $r_{Coil}$—resistance of the secondary coil and $\omega$—frequency of excitation. Thus, with change in $I_P$, the dynamic impedance system changes $r_b$ in order to regulate flux Φ. This is done by regulating the voltage across the burden $V_{burden}$ where the governing equation of the flux Φ also is:

$$\Phi = \frac{V_{burden} + (I_S * r_{Coil})}{(N_S * \omega)}$$

where ω—line frequency, $V_{burden}$ is the secondary voltage, that is, voltage across the dynamic impedance system 201 due to secondary current $I_S$, $r_{Coil}$—resistance of a coil of the secondary winding element 204, and $N_S$—number of turns of the coil of the secondary winding element 204. In the above equation, the flux Φ is near independent of the primary current $I_P$. The dependence is limited to a negligible drop across $r_{Coil}$. The coil resistance $r_{Coil}$ is in the order of ohms and hence, increase in drop across coil resistance $r_{Coil}$ is therefore, negligible. Thus, flux Φ is regulated irrespective of an increase in the primary current $I_P$.

FIG. 2C depicts the dynamic impedance system 201 including the voltage reference module 201A and the dynamic impedance module 201B. The voltage reference module 201A includes Zener diodes D7, D10, D13, D6, D9 and D12 used to set a voltage threshold, that is, a limiting value at which the secondary voltage is to be regulated. Quantity of the Zener diodes and their ratings may be customized based on the voltage threshold required to be set. The voltage threshold is defined based on downstream electronics which is connected and/or powered by the current transformer 200. The dynamic impedance module 201B includes power transistors, that is, MOSFETs Q8, Q9 and Q6, Q7. Each of the pairs of these MOSFETs are connected to the Zener diodes D7, D10, D13 and D6, D9, D12 via PNP transistors Q5 and Q10 for operation in positive cycle and negative cycle respectively. During a positive cycle of operation, when an input voltage, that is, the secondary voltage, rises above the voltage threshold defined by a combined breakdown voltage of the Zener diodes D7, D10, and D13, and the $V_{BE}$ drop of the PNP transistor Q5, then the Q5 conducts. Thus, the voltage threshold is defined by the equation given below:

$$V_{threshold} = V_{Zener} + V_{BE}$$

With this a proportional current flows on the collector of Q5 increasing the $V_{GS}$ voltage of the MOSFETs Q8 and Q9. As this $V_{GS}$ voltage increases, the $R_{DS}$ of the MOSFETs decrease. As $R_{DS}$ decreases additional current is drawn from the source, thereby, increasing drop across $r_{Coil}$, that is, the secondary winding element 204. This results, in a decrease in the voltage across the Zener diodes D7, D10, and D13, and therefore the $V_{BE}$ of the PNP transistor Q5, thereby reducing, the collector current of Q5 and $V_{GS}$ voltage of the MOSFETs Q8 and Q9. As this $V_{GS}$ voltage decreases, the $R_{DS}$ of the MOSFETs increases thereby reducing current drawn from the source. This in turn reduces the drop across $r_{Coil}$, that is, the secondary winding element 204 thus, bringing back the operation state to an original state. This thus completes the control exerted by the dynamic impedance system 201 thereby limiting the output voltage of the current transformer 200. The additional current is mainly drawn by the MOSFETs Q8 and Q9 which are power devices and hence, are capable of handling larger power as compared to the Zener diodes D7, D10, and D13. The operation explained here is for the positive cycle operation and the negative cycle operation is the same with polarities reversed where the Zener diodes D6, D9, and D12 along with the PNP transistor Q10 and MOSFETs Q6 and Q7 come into operation.

Thus, the dynamic impedance module 201B employs power MOSFETs Q7, Q8, Q9, and Q10, as dynamic burden resistors and regulates output voltage across the current transformer 200 by changing $V_{GS}$ of the MOSFETs in comparison to the voltage threshold set using high precision low power Zener diodes D7, D10, D13, D6, D9, and D12. By dynamically changing the burden resistor and thereby drawing additional current from the source, an additional voltage drop across source impedance is created which acts as a negative feedback control system for the current transformer 200 thereby avoiding flux increase and saturation of core 202.

Figure 3:
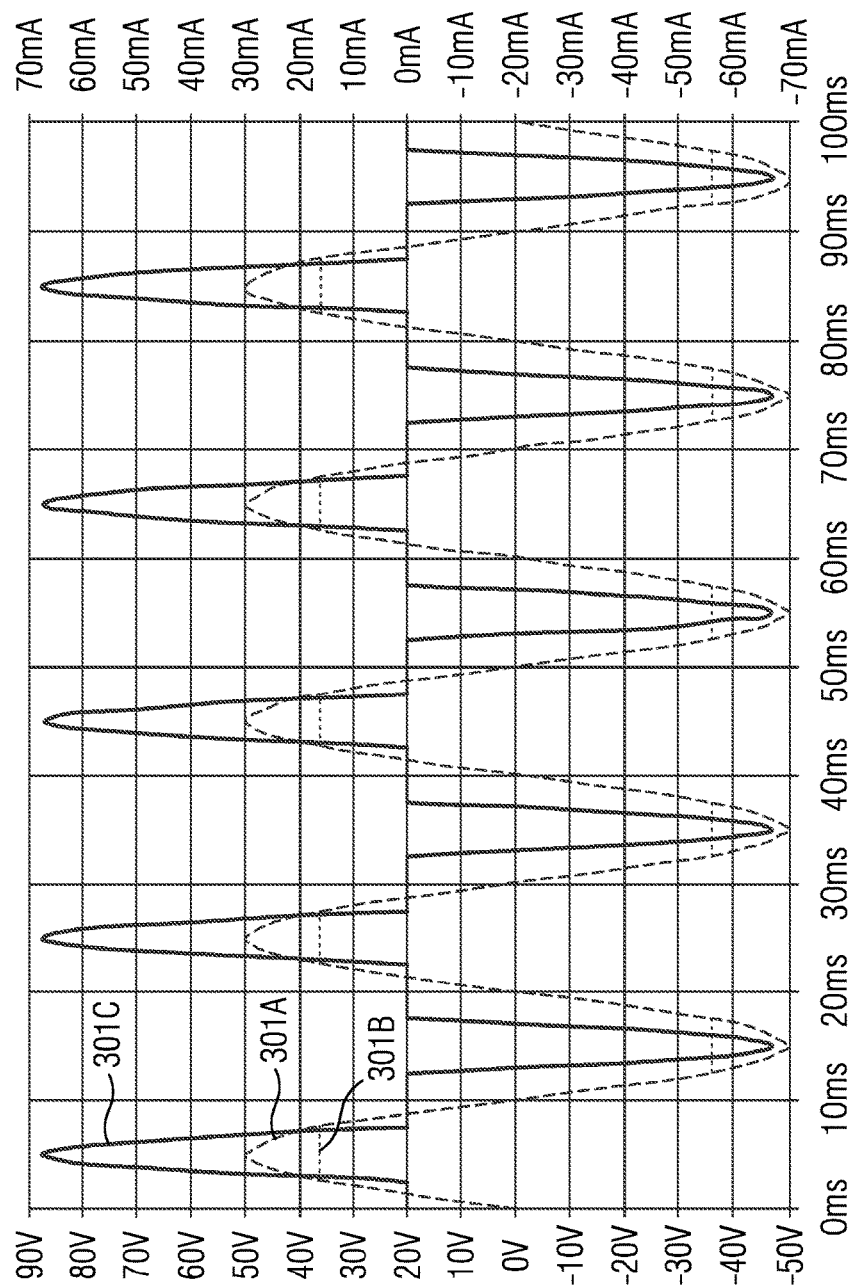
FIG. 3 illustrates a graphical representation of voltage waveforms associated with the current transformer in operable communication with the dynamic impedance system illustrated in FIGS. 2A-2C.

FIG. 3 illustrates a graphical representation of voltage waveforms 301A, 301B, and 301C, associated with the current transformer 200 depicted in FIG. 2A, in operable communication with the dynamic impedance system 201 illustrated in FIGS. 2A-2C. The voltage waveforms 301A, 301B, and 301C are plotted with respect to time and current drawn by the dynamic impedance module 201B. The voltage waveform 301A represents an input voltage which is induced due to the flux. The voltage waveform 301B represents the voltage limited by the dynamic impedance system 201 beyond a voltage threshold of 37V which is achieved with a 36.3V Zener diode combination with 0.7V VBE drop. The voltage waveform 301C represents the current drawn by the dynamic impedance system 201 to maintain the output voltage of the current transformer constant.

Figure 4:
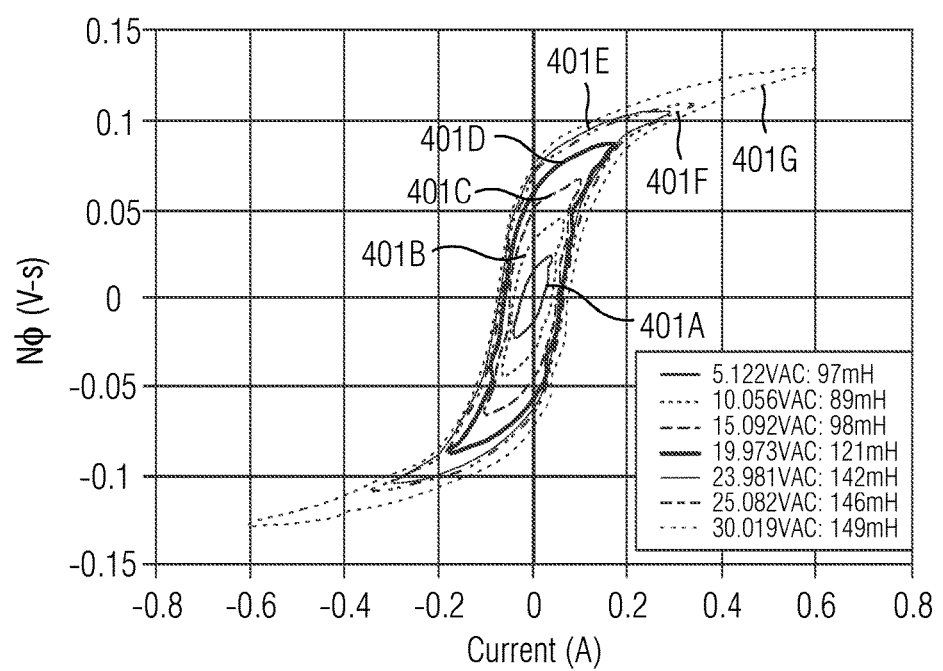
FIG. 4 illustrates a hysteresis graphical representation of flux waveforms of the current transformer in relation with the output voltage of the current transformer as a result of an increase in secondary current.

FIG. 4 illustrates a hysteresis graphical representation of flux waveforms 401A, 401B, 401C, 401D, 401E, 401F, and 401G of the current transformer 200 in relation with the output voltage of the current transformer 200 as a result of an increase in secondary current $I_S$. The flux waveform 401A shows the flux being limited as a result of voltage limiting achieved by the dynamic impedance system 201 depicted in FIGS. 2A-2C when deployed on the current transformer 200. Whereas, the flux waveforms 401B-401G depict an increase in flux with the increase in output voltage, that is, in absence of a voltage limiting technique employed using the dynamic impedance system 201 with the current transformer 200. In the region depicted by the flux waveform 401A, the hysteresis graph remains largely linear thereby, resulting in a higher accuracy of measurement of the current transformer 200.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A dynamic impedance system deployable on a current transformer, the dynamic impedance system comprising:
   a voltage reference module configured to define a voltage threshold for regulating an output voltage of the current transformer; and
   a dynamic impedance module configured to regulate the output voltage based on the voltage threshold defined by the voltage reference module to maintain flux induced in the current transformer,
   wherein the dynamic impedance module is configured as a variable load for the current transformer.

2. The dynamic impedance system of claim 1, wherein the voltage reference module defines the voltage threshold based on one or more properties associated with the current transformer.

3. The dynamic impedance system of claim 1, wherein the voltage reference module comprises at least one diode selected based on the voltage threshold.

4. The dynamic impedance system of claim 1, wherein the dynamic impedance module comprises at least one power transistor in operable communication with the voltage reference module and selected based on the voltage threshold.

5. A dynamic impedance system deployable on a current transformer, the dynamic impedance system comprising:
   a voltage reference module configured to define a voltage threshold for regulating an output voltage of the current transformer; and
   a dynamic impedance module configured to regulate the output voltage based on the voltage threshold defined by the voltage reference module to maintain flux induced in the current transformer,
   wherein the voltage reference module defines the voltage threshold based on one or more properties associated with the current transformer, wherein the one or more properties comprise a material of a core of the current transformer, a material of a winding element of the current transformer, a geometry of the core, a geometry of the winding element, a saturation limit of the core, and the output voltage of the current transformer.

6. The dynamic impedance system of claim 5, wherein the voltage reference module comprises at least one diode selected based on the voltage threshold.

7. The dynamic impedance system of claim 5, wherein the dynamic impedance module comprises at least one power transistor in operable communication with the voltage reference module and selected based on the voltage threshold.

8. A current transformer comprising:
   a core;
   at least one winding element; and
   a dynamic impedance system in operable communication with the at least one winding element, wherein the dynamic impedance system comprises:
      a voltage reference module configured to define a voltage threshold for regulating an output voltage of the current transformer; and
      a dynamic impedance module configured to regulate the output voltage based on the voltage threshold defined by the voltage reference module to maintain flux induced in the current transformer,
   wherein the dynamic impedance module is configured as a variable load for the current transformer.

* * * * *